United States Patent [19]

Jungroth

[11] Patent Number: 4,858,186
[45] Date of Patent: Aug. 15, 1989

[54] A CIRCUIT FOR PROVIDING A LOAD FOR THE CHARGING OF AN EPROM CELL

[75] Inventor: Owen W. Jungroth, Sonora, Calif.
[73] Assignee: Intle Corporation, Santa Clara, Calif.
[21] Appl. No.: 144,569
[22] Filed: Jan. 12, 1988
[51] Int. Cl.[4] .................. G11C 11/34; G11C 7/00
[52] U.S. Cl. .................... 365/185; 365/104; 365/189.11
[58] Field of Search ........... 365/104, 185, 210, 189.11, 365/210

[56] References Cited

U.S. PATENT DOCUMENTS

| | | | |
|---|---|---|---|
| 4,541,077 | 9/1985 | Rapp | 365/104 |
| 4,710,900 | 12/1987 | Higuchi | 365/185 |
| 4,725,984 | 2/1988 | Ip et al. | 365/189 X |
| 4,737,936 | 4/1988 | Takeuchi | 365/185 |
| 4,768,170 | 8/1988 | Hoff | 365/189 |

FOREIGN PATENT DOCUMENTS

| | | | |
|---|---|---|---|
| 54-152826 | 12/1979 | Japan | 365/185 |
| 60-57597 | 3/1985 | Japan | 365/104 |

OTHER PUBLICATIONS

"A 256-kbit Flash E[2] PROM Using Triple-Polysilicon Technology", F. Masuoka et al., IEEE Journal of Solid-State Circuits, vol. SC-22, No. 4, pp. 548-552, Aug. 1987.

Primary Examiner—Stuart N. Hecker
Assistant Examiner—Alfonso Garcia
Attorney, Agent, or Firm—Blakely, Sokoloff, Taylor & Zafman

[57] ABSTRACT

A circuit for providing a programming potential to an electrically programmable read-only memory (EPROM) cell is disclosed. The circuit includes a matched pair of transistors coupled in series and having their gates coupled to a resistor for providing a reference potential. A decoder and latch transfers this potential to another pair of match transistors coupled in series with the EPROM cell. The reference potential is optimized for programming of the cell. The circuit is configured to substantially reduce the load line variations resulting from changes in process and temperature.

8 Claims, 1 Drawing Sheet

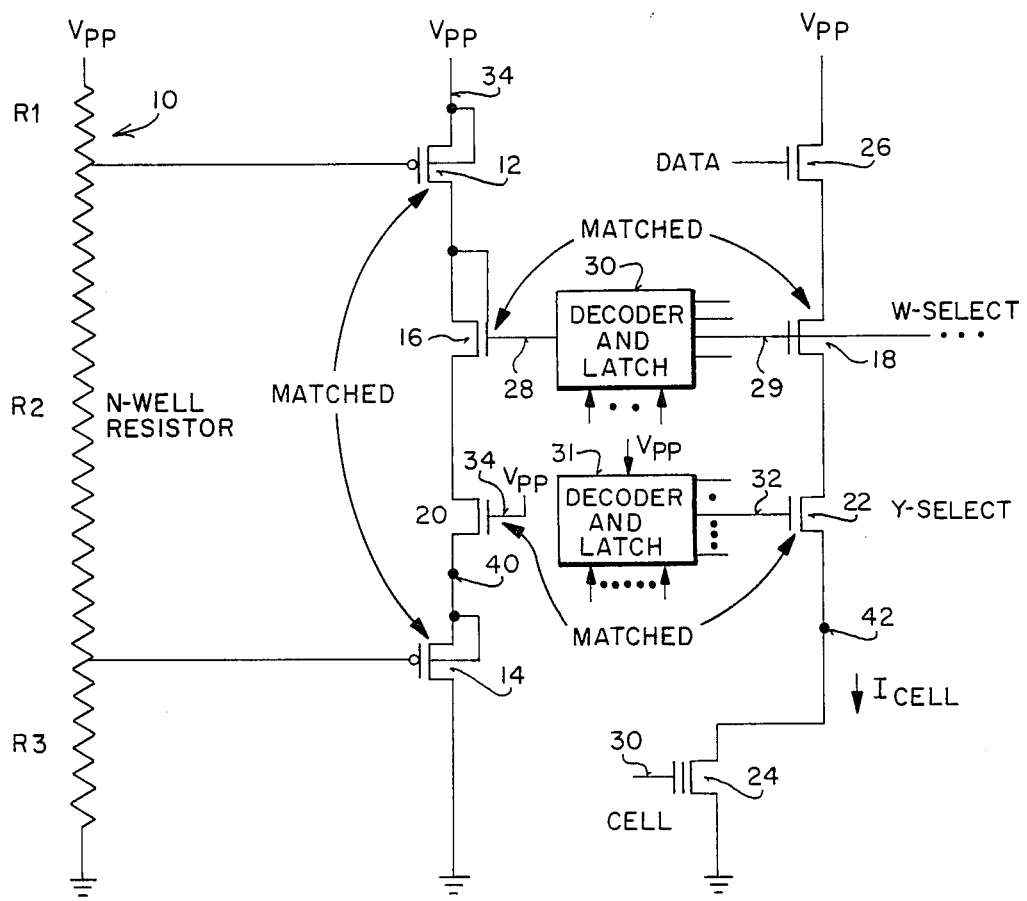
FIG_1
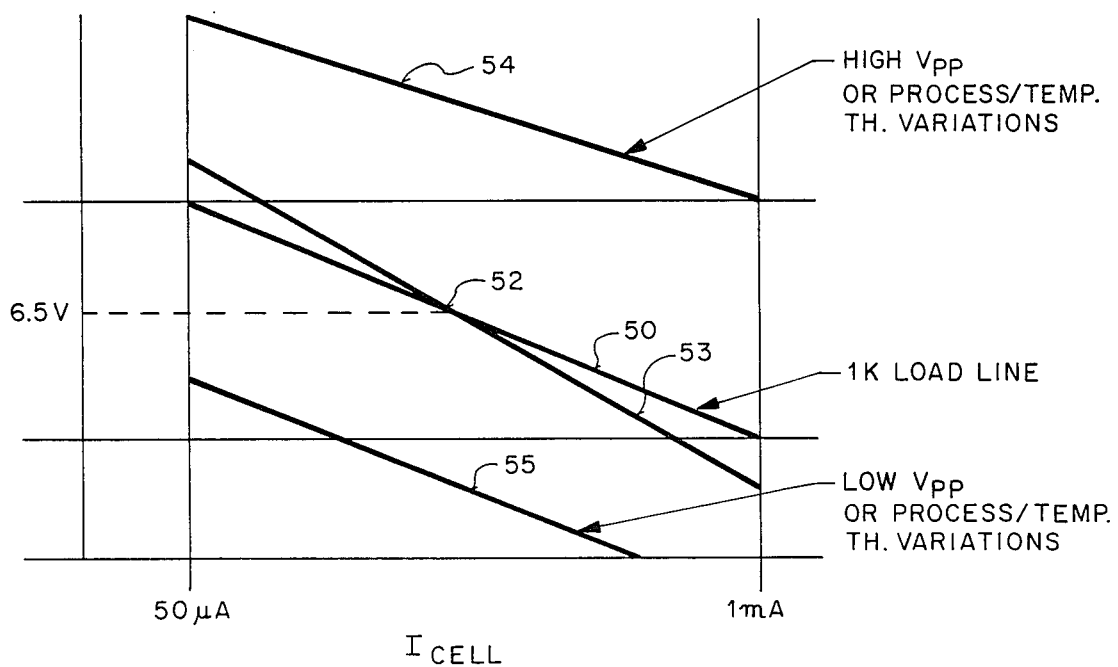
FIG_2 (LOAD LINE)

A CIRCUIT FOR PROVIDING A LOAD FOR THE CHARGING OF AN EPROM CELL

BACKGROUND OF THE INVENTION

1. Field of the Invention

The invention relates to the field of metal-oxide-semiconductor (MOS) electrically programmable and electrically erasable read-only memories (EEPROMs) having floating gates and to electrically programmable read-only memories (EPROMs).

2. Prior Art

The most commonly used EPROM cell has an electrically floating gate which is completely surrounded by insulation and generally disposed between source and drain regions. In early versions of these cells, charge is injected through the insulation by avalanche injection such as the device described in U.S. Pat. No. 3,660,819. Later versions of EPROMs relied on channel injection for charging the floating gate as shown in U.S. Pat. Nos. 4,142,926; 4,114,255 and 4,412,310. These EPROMs are erased by exposing the array to ultraviolet radiation.

Electrically erasable EPROMs (EEPROMs) are also commercially available. In some cases, charge is placed into and removed from a floating gate by tunneling the charge through a thin oxide region formed on the substrate (see U.S. Pat. No. 4,203,158). In other instances, charge is removed through an upper electrode (see U.S. Pat. No. 4,099,196).

EPROMs are most often removed from their printed circuit boards for both erasing and programming. A programming device (e.g., commercially available programmer) is used for programming the cells. This device controls the voltage and current applied to the cells during programming. Current and voltage must be regulated to assure that too much current/voltage is not applied to the cell for reasons which are described later in the application. This regulation is easily accomplished within a programmer, since, for example, the voltages within the programmer can be calibrated when the device is manufactured and/or stable voltage regulations are well-known.

EEPROMs are typically programmed and erased while installed in the same circuit (e.g., printed circuit board) used for reading data from the memory. That is, a separate programming device is not used. Since these devices are typically programmed by tunnelling, the control, particularly of current, is not as critical as with EPROMs.

A problem arises with flash EPROMs where the memories are programmed through on-chip circuitry, that is, where a separate programming device is not used. The current/voltage for programming the cells must be controlled and this control must be consistent from chip-to-chip. The present invention is directed toward a load line for providing this control.

The closest prior art known to Applicant is described in an article entitled "A 256-K Bit Flash E2PROM Using Triple—Polysilicon Technology", IEEE Journal of Solid-State Circuits, Vol SC22, No. 4, Aug. 1987.

SUMMARY OF THE INVENTION

A circuit for providing a load line in a flash EPROM is described. A first and second matched transistors are coupled in series with a third transistor. The gates of the first and second transistors are coupled to a resistor. A fourth transistor, matched to the third transistor is coupled to the cell to provide a load. This fourth transistor is typically a "select" transistor in the memory array. The gate of the third transistor and its drain terminal are connected to the gate of the fourth transistor when the fourth transistor is selected.

BRIEF DESCRIPTION OF THE DRAWINGS

FIG. 1 is an electrical schematic of the presently preferred embodiment of the invention.

FIG. 2 is a graph illustrating several load lines and is used to describe the problems sought to be solved by the present invention.

DETAILED DESCRIPTION OF THE PRESENT INVENTION

A load line for electrically programmable and electrically erasable read-only memories, particularly memories referred to as flash EPROMs is described. In the following description, numerous specific details are set forth such as specific conductivity types and voltages in order to provide a thorough understanding of the present invention. It will be obvious, however, to one skilled in the art that these details are not required to practice the invention. In other instances, well-known processes and other details associated with MOS circuits are not described in detail, in order not to unnecessarily obscure the present invention.

The object of the present invention is to provide a load line for an EPROM cell such as cell 24 of FIG. 1 for use when programming the cell. The memory cell employed in the presently preferred embodiment includes a floating gate separated from the channel region by an oxide thickness of approximately 110Å. A control gate which is fabricated from a second layer of polysilicon overlies the floating gate. The floating gate is charged by the channel injection of electrons into the floating gate and discharged by the tunnelling of charge from the floating gate through the gate oxide. The details of the cell are described in copending application Ser. No. 892,446, filed Aug. 4, 1986, entitled "Low Voltage EEPROM Cell", which application is assigned to the assignee of the present invention.

To program the cell 24, a positive potential is applied to the control gate through line 30 and the drain terminal (connected to node 42) is brought to a positive potential. This causes the injection of charge into the gate from the channel. During this injection, the drain region should be maintained at approximately 6.5 volts (for the currently preferred embodiment). If this voltage drops much below 6 volts, the hot electron injection ceases and the cell is not programmed. On the other hand, if the drain voltage exceeds 7 volts, there is a disturbance of other memory cells connected to line 42 that had been programmed causing them to lose some charge. Therefore, it is important that the potential on the drain region remain within certain limits during programming. As is well-known, potentials in MOS circuits vary widely due to both process variations and temperature.

In FIG. 1, the potential applied to the drain of cell 24 (as well as other cells) is developed from the programming potential identified as $V_{pp}$. This potential is coupled to the cell through a enhancement mode field-effect transistor 26, the gate of which receives a data signal. That is, transistor 26 determines whether or not the cell is to be programmed. The field-effect transistors 18 and 22 select particular cells in an ordinary manner when the cells are in an array.

It it is assumed that node 42 is to remain at 6.5 volts and the current through cell 24 should be approximately 500 microamps, a load line of 1K ohms results. this is shown as load line 50 in FIG. 2; 6.5 volts at 500 microamps is shown as point 52. A current close to zero (50 microamps) defines one vertical limit of load line 50, the opposite limit is shown at 1 milliamp. If the potential $V_{pp}$ is high, the potential on node 42 will be higher than 6.5 volts resulting, by way of example, in a load line 54. This is an undesirable condition which will also result from process variations and temperature excursions affecting the threshold voltages of the devices in the load line. Similarly, if the $V_{pp}$ potential is low, an undesirable condition represented by line 55 results. This condition will also be caused by process variations and temperature excursions affecting the threshold voltages. Ideally, the load line should be represented by line 50 or at least cross point 52 such as indicated by line 53. Process variations not associated with the threshold voltages of the devices will more generally tend to change the slope of the load line (e.g., line 53) rather than moving the line up or down (e.g., lines 54 and 55).

The circuit of the present invention substantially reduces the load line variations resulting from threshold voltage changes particularly those associated with process variations and temperature. This provides the desired potential on node 42 for programming the cells. (It is assumed that the voltage of $V_{pp}$ remains relatively constant at a predetermined potential. This can be easily achieved with other well-known circuits particularly where this potential is developed off-chip.)

Referring to FIG. 1, two levels of decoding are used in the currently preferred embodiment to select a current path from $V_{pp}$ (programming potential) to the selected cell. Decoder and latch 30 decodes first address signals and selects one of four W-select transistors such as transistor 18. The decoder and latch 30 transfers the potential on line 28 to line 29. The latch receives a high potential and hence, is able to transfer the potential on line 28 to line 29 without a voltage drop. Other address signals are coupled to the decoder and latch 31. This decoder and latch selects one of 16 Y-select transistors, one of whicih is shown as transistor 22 in FIG. 1. In this manner, a single cell is selected for programming.

For purposes of understanding the present invention, it is unnecessary to consider all the W-select and Y-select transistors and thus, only a single W-select and Y-select transistor are shown in FIG. 1.

The potential applied to the gate of transistor 18 is developed by a voltage reference circuit which comprises the resistor 10 and transistors 12, 16, 20 and 14. The transistors 12, 16, 20 and 14 are coupled in series between the $V_{pp}$ potential and ground. Transistors 12 and 14 are matched and in the presently preferred embodiment are p-channel, enhancement mode, field-effect transistors. Transistors 16 and 20 are n-channel, enhancement mode field-effect transistors. Transistor 16 is matched to the W-select transistors, such as transistor 18. Transistor 20 is matched to the Y-select transistors such as transistor 22. The gate of transistor 16 is connected to that transistor's drain region which provides the potential on line 28. (This potential is coupled to line 29.) The gate of transistor 20 receives the $V_{pp}$ potential via line 34. This potential is also coupled to the selected one of the Y-select transistors by the decoder and latch 31; in FIG. 1 the $V_{pp}$ potential is connected to line 32 and the gate of transistor 22.

In the currently preferred embodiment the resistor 10 comprises a diffusion formed in the substrate and coupled between $V_{pp}$ and ground. A first tap in this diffusion is connected to the gate of transistor 12 and a second tap to the gate of transistor 14. For purposes of discussion, it is assumed that the resistance $R_1$ is present between $V_{pp}$ and the gate of transistor 12, a second resistance $R_2$ between the gates of transistors 12 and 14 and a third resistance $R_3$ between the gate of transistors 12 and ground.

Transistors 12 and 14 are matched in that they both have the same channel width and length and are fabricated close to one another on the substrate so that they are both subjected to the same processing. Since the process variations between these transistors will be very slight, they both have the same threshold voltage. (By connecting the n-wells to their source, they have no body effect). Similarly, as mentioned, transistors 16 and 18 are matched as are transistors 20 and 22.

As mentioned earlier, node 42 is ideally maintained at approximately 6.5 volts. The reference circuit is designed so that node 40 is at approximately 6.5 volts with a current of 500 microamps. Numerous well-known design techniques and simulations may be utilized to design the circuit comprising transistors 12, 16, 20 and 14 to provide this potential. As a first order approximation, the potential on node 40 is equal to:

$$V_{PP} = \frac{R_1 + R_3}{R_1 + R_2 + R_3}$$

More precise establishment of the potential on node 40 can be made by taking into account secondary factors.

A potential from the reference circuit (drain region of transistor 16) is coupled to the load line (gate of transistor 18) through lines 28 and 29. Thus, transistor 18 is maintained in saturation by the same potential as is driving transistor 16. Transistors 20 and 22 operate in their linear regions and both are coupled to receive the same potential, $V_{pp}$. The potentials on node 40 and hence, the potential on node 42 remain relatively constant since variations in the threshold voltages of transistors 12 and 14 cancel each other. The variations in threshold voltages for transistors 16 and 20 are compensated for by the fact that transistors 18 and 22 are matched with transistors 16 and 20, respectively. This arrangement assures that the current through the cell 24 during programming will be within the desired range as discussed above and shown in FIG. 2.

After programming (and after erasing) the adequacy of the programming and erasing of the cell 24 is verified. The circuit used for developing internal margined voltage for this verification also uses matched transistors and is described in copending application, Ser. No. 07/144,567, filed 1/12/88, entitled "Voltage Margining Circuit for Flash EPROM", and assigned to the assignee of the present invention.

Thus, a circuit for providing a load for the charging of an electrically programmable read-only memory cell has been described. A matched pair of transistors are used to provide a reference potential which potential is coupled to another pair of matched transistors.

I claim:

1. A circuit for providing a load for the charging of an electrically programmable, read-only memory cell comprising:
 a resistive means;

a first and a second matched transistors coupled in series, the gates of said first and second transistors being coupled to said resistive means;

a third and a fourth matched transistors, said third transistor being coupled in series with said first and second transistors, said fourth transistor being coupled in series with said cell, the gate of said third and fourth transistors being coupled to a node disposed between said first and second transistors.

2. The circuit defined by claim 1 wherein said first and second transistors are of a first conductivity type and said third and fourth transistors are of opposite conductivity type.

3. The circuit defined by claim 2 including a fifth and sixth matched transistors, said fifth transistor being coupled in series with said first, second and third transistors and said sixth transistor being coupled in series with said fourth transistor.

4. The circuit defined by claim 3 wherein said fifth and sixth transistors are of said second conductivity type.

5. The circuit defined by claim 2 wherein said fourth transistor is selected by a first decoder.

6. The circuit defined by claim 4 wherein said fourth and sixth transistors are selected by decoders.

7. A circuit for providing a load for the charging of an electrically programmable, read-only memory cell having a floating gate and a control gate comprising:

a resistive means;

a first and a second matched transistors of a first conductivity type;

a third and a fourth matched transistors of a second conductivity type;

a fifth and a sixth matched transistors of a second conductivity type;

said first, third, fifth and second transistors being coupled in series, with said third and fifth transistors being coupled between said first and second transistors, said gates of said first and second transistors being coupled to said resistive means so that each of said gates receive a different potential from said resistive means;

said fourth and sixth transistors being coupled in series with said cell, the gates of said third and fourth transistors being coupled to a node disposed between said first and second transistors and the gates of said fifth and sixth transistors being coupled to a common potential.

8. The circuit defined by claim 7 wherein said fourth and sixth transistors are selected by decoders.

* * * * *

UNITED STATES PATENT AND TRADEMARK OFFICE
CERTIFICATE OF CORRECTION

PATENT NO. : 4,858,186

DATED : 8/15/89

INVENTOR(S) : Jungroth

It is certified that error in the above-identified patent and that said Letters Patent is hereby corrected as shown below:

| | | |
|---|---|---|
| col. 01, line 26 | delete "th" | insert --the-- |
| col. 03, line 01 | delete "It" | insert --If-- |
| col. 03, line 04 | delete "this" | insert --This-- |
| col. 03, line 44 | delete "whicih" | insert --which-- |

Signed and Sealed this

Twelfth Day of March, 1991

Attest:

HARRY F. MANBECK, JR.

*Attesting Officer*  *Commissioner of Patents and Trademarks*